United States Patent
Watanabe et al.

(10) Patent No.: US 11,502,120 B2
(45) Date of Patent: Nov. 15, 2022

(54) NEGATIVELY BIASED ISOLATION STRUCTURES FOR PIXEL DEVICES

(71) Applicant: OMNIVISION TECHNOLOGIES, INC., Santa Clara, CA (US)

(72) Inventors: Kazufumi Watanabe, Mountain View, CA (US); Chih-Wei Hsiung, San Jose, CA (US); Vincent Venezia, Los Gatos, CA (US); Young Woo Jung, San Jose, CA (US); Geunsook Park, Cupertino, CA (US); Lindsay Alexander Grant, Campbel, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 0 days.

(21) Appl. No.: 16/721,320

(22) Filed: Dec. 19, 2019

(65) Prior Publication Data

US 2021/0193703 A1 Jun. 24, 2021

(51) Int. Cl.
*H01L 27/146* (2006.01)

(52) U.S. Cl.
CPC ...... *H01L 27/1463* (2013.01); *H01L 27/1464* (2013.01); *H01L 27/14605* (2013.01); *H01L 27/14612* (2013.01); *H01L 27/14636* (2013.01); *H01L 27/14643* (2013.01); *H01L 27/14687* (2013.01)

(58) Field of Classification Search
CPC .......... H01L 27/1463; H01L 27/14636; H01L 27/1464; H01L 27/14643
See application file for complete search history.

(56) References Cited

U.S. PATENT DOCUMENTS

| | | | | |
|---|---|---|---|---|
| 7,297,995 | B2 * | 11/2007 | Mouli | H01L 27/14683 257/292 |
| 8,766,164 | B2 * | 7/2014 | Sanfilippo | H01L 31/1075 257/438 |
| 8,860,099 | B2 * | 10/2014 | Tatani | H01L 27/14643 257/292 |
| 9,054,007 | B2 * | 6/2015 | Hu | H01L 27/0928 |
| 9,160,949 | B2 * | 10/2015 | Zhang | H01L 31/02027 |
| 9,496,304 | B2 * | 11/2016 | Hu | H01L 27/1464 |
| 9,595,555 | B2 * | 3/2017 | Tekleab | H01L 27/14641 |
| 9,748,299 | B2 * | 8/2017 | Ahn | H01L 27/14612 |
| 9,806,117 | B2 * | 10/2017 | Zheng | H01L 27/14636 |

(Continued)

*Primary Examiner* — David A Zarneke
(74) *Attorney, Agent, or Firm* — Christensen O'Connor Johnson Kindness PLLC

(57) ABSTRACT

Backside illuminated sensor pixel structure. In one embodiment, and image sensor includes a plurality of pixels arranged in rows and columns of a pixel array that are disposed in a semiconductor substrate. Individual photodiodes of the pixel array are configured to receive an incoming light through a backside of the semiconductor substrate. A front side of the semiconductor substrate is opposite from the backside. A plurality of transistors disposed proximate to the front side of the semiconductor substrate, are arranged in a row along an outer perimeter of the photodiodes of the respective pixel; and a plurality of isolation structures arranged to bracket the row of transistors along the outer perimeter of the photodiodes. A plurality of contacts electrically contacting the plurality of isolation structures, and the contacts are configured to voltage-bias the plurality of isolation structures.

27 Claims, 14 Drawing Sheets

(56) References Cited

U.S. PATENT DOCUMENTS

| | | | |
|---|---|---|---|
| 10,177,191 B1 | 1/2019 | Cheng et al. | |
| 10,269,850 B2* | 4/2019 | Zheng | H01L 27/14621 |
| 10,438,987 B2* | 10/2019 | Mandai | H04N 5/3698 |
| 10,566,359 B1* | 2/2020 | Leung | H01L 27/14603 |
| 2022/0005849 A1* | 1/2022 | Zang | H01L 27/1463 |

* cited by examiner

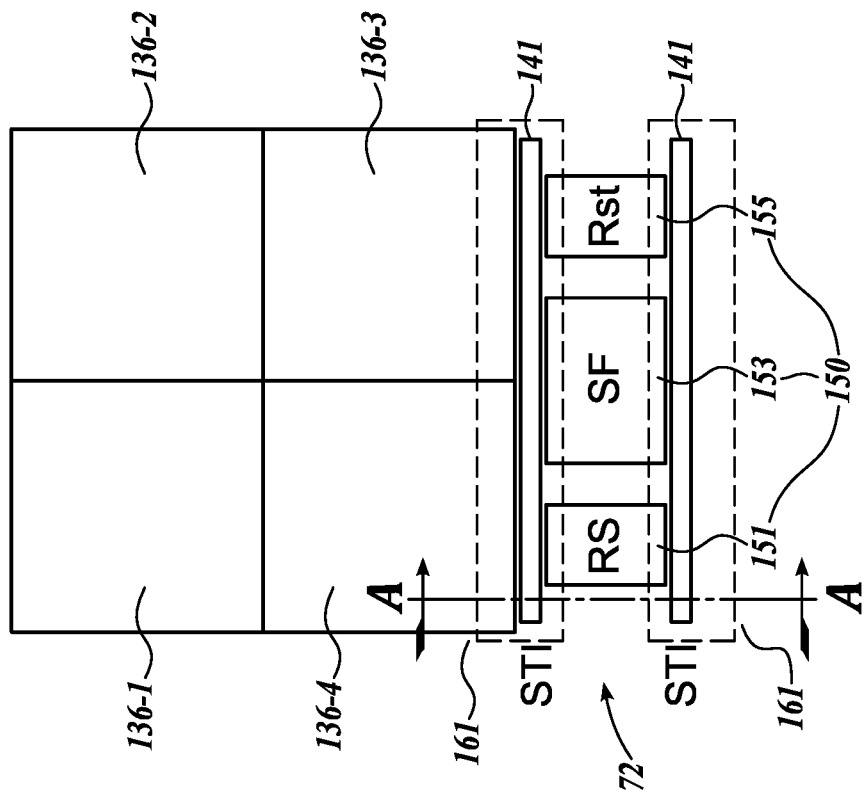
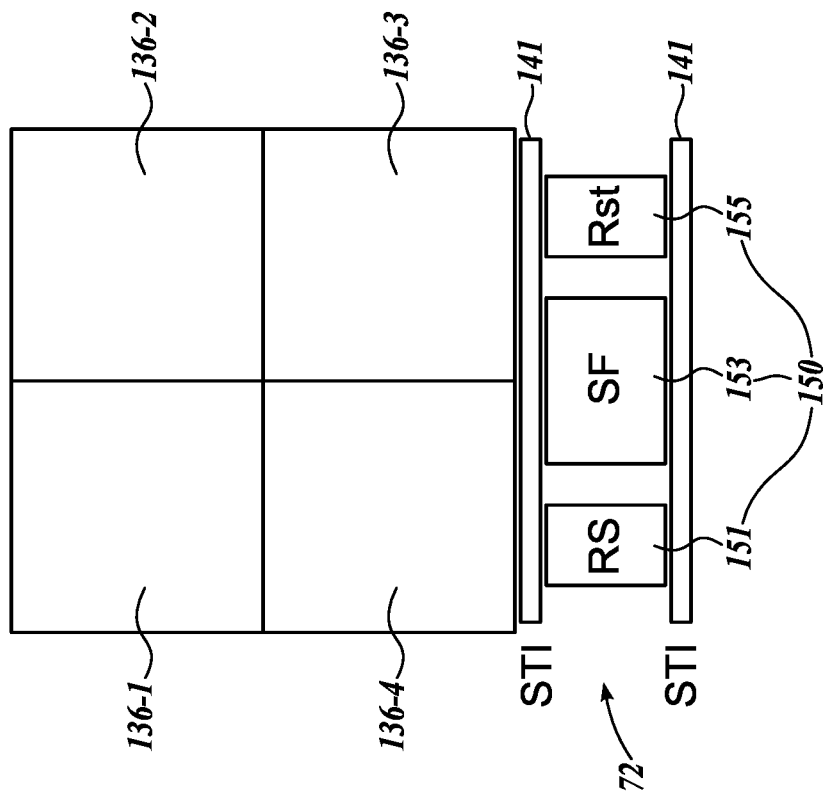
FIG. 3A
FIG. 3B

CROSS-SECTION A-A

CROSS-SECTION B-B

CROSS-SECTION C-C

NEGATIVELY BIASED ISOLATION STRUCTURES FOR PIXEL DEVICES

BACKGROUND INFORMATION

Field of the Disclosure

This disclosure relates generally to the design of image sensors, and in particular, relates to image sensors that produce dark current.

Background

Image sensors have become ubiquitous. They are widely used in digital still cameras, cellular phones, security cameras, as well as medical, automotive, and other applications. The technology for manufacturing image sensors continues to advance at a great pace. For example, the demands for higher image sensor resolution and lower power consumption motivate further miniaturization and integration of image sensors into digital devices.

As the resolution of image sensors is increased, the spacing between the photodiodes is typically decreased, resulting in narrower and deeper photodiodes. These more closely packed photodiodes are more susceptible to interference by dark current. Some image sensors include Shallow Trench Isolations (STIs), and STI is known to be one of the sources of dark current. A known technique for reducing dark current associated with STIs is to passivate sidewalls and bottom of STIs with passivation implants to reduce defects or trap sites on sidewalls and bottom. Such defects may otherwise trap electrons and generate dark current. However, in doing so, the area of the photodiode may be reduced as the implant doping may diffuse into the silicon substrate, resulting in encroachment of the passivation implant doping onto the photodiode region.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 3A-3C are various views of pixels of an example image sensor in accordance with an embodiment of the present technology.

Figure 1:
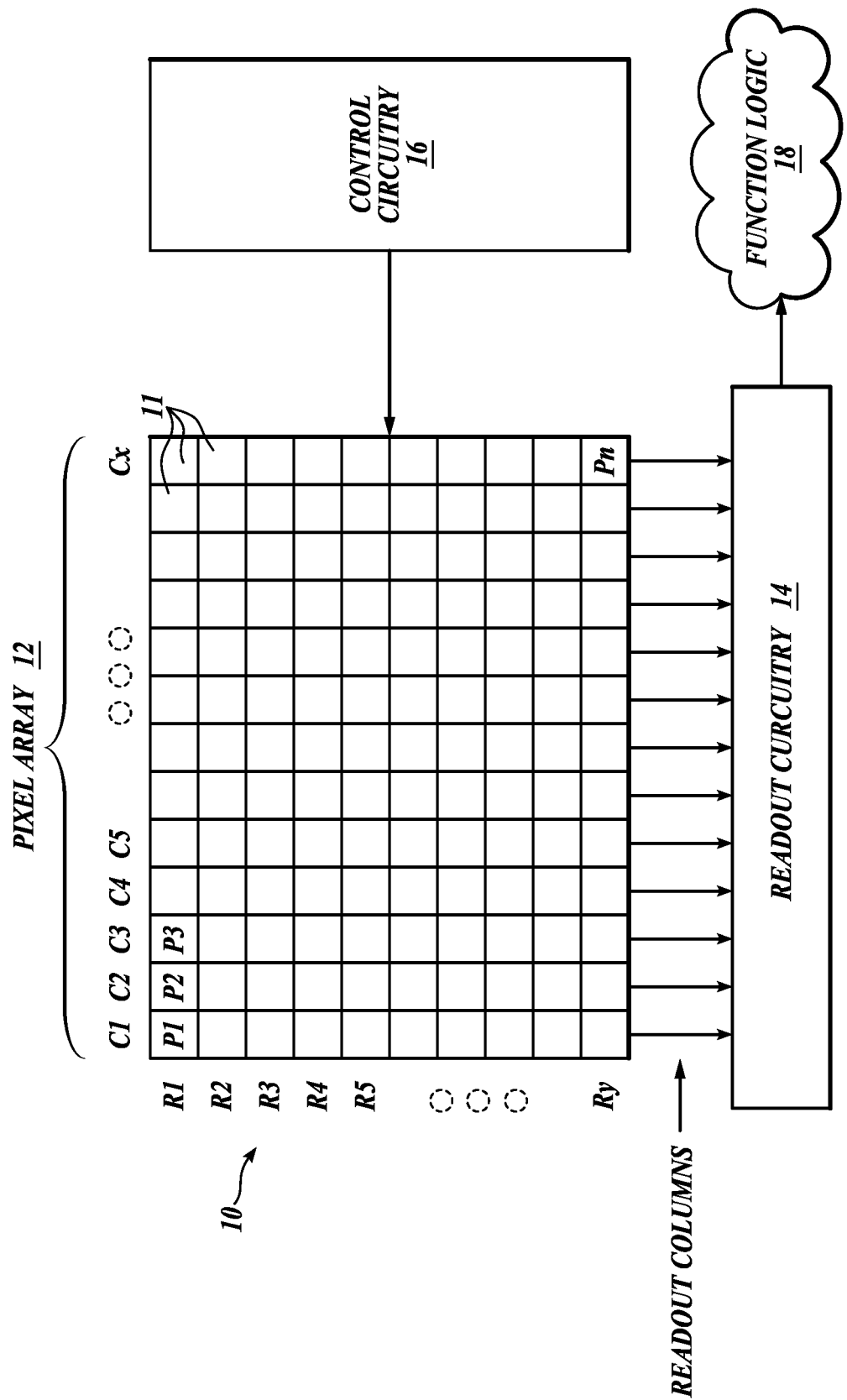
FIG. 1 is a diagram of an example image sensor in accordance with an embodiment of the present technology.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors, and in particular, image sensors having reduced dark current are disclosed. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

In the present disclosure, the terms "semiconductor substrate" or "substrate" refer to any type of substrate used for forming semiconductor devices thereon, including single crystal substrates, semiconductor on insulator (SOI) substrates, doped silicon bulk substrate, and epitaxial film on semiconductor (EPI) substrates and the like. Further, although the various embodiments will be primarily described with respect to materials and processes compatible with silicon-based semiconductor materials (e.g., silicon and alloys of silicon with germanium and/or carbon), the present technology is not limited in this regard. Rather, the various embodiments can be implemented using any types of semiconductor materials.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, the embodiments of the present technology are directed to photodiodes (also sometimes referred to as pixels) having reduced dark current and having increased photodiode area. The backside illuminated photodiodes have a row of transistors on the front side of the semiconductor substrate. C-shaped isolation structures bracket the row of transistors to reduce the dark current of the photodiode. In some embodiments, the isolation structures are at least partially surrounded by a doped region of the substrate. Contacts are electrically contacting the isolation structures to voltage-bias the isolation structures. In some embodiments, the isolation structures are negatively biased.

In some embodiments, the isolation structures include an upper isolation structure and a trench isolation structure. The upper isolation structures extend out of a front side of the semiconductor substrate. The trench isolation structures are at least partially embedded into the front side of the semiconductor substrate. In some embodiments, the isolation structures consist of just an upper isolation structure at the front side of the semiconductor substrate.

FIG. 1 is a diagram of an example image sensor 10 in accordance with an embodiment of the present technology. The image sensor 10 includes pixels 11 that are arranged in rows (R) and columns (C) of a pixel array 12. When the image sensor 10 is exposed to light, the individual pixels 11 (also referred to as photodiodes) acquire certain voltage values. After each pixel has acquired its voltage value, the image data is readout by a readout circuitry 14, and then transferred to a function logic 18.

Voltage values of the individual pixels ($P_1$-$P_n$) can be captured by the readout circuitry 14. For example, a control circuitry 16 may determine a specific row $R_i$ of the pixel array 12 for coupling with the readout circuitry 14. After the pixel values in row $R_i$ are captured, the control circuitry 16 may couple row $R_{i+1}$ with the readout circuitry 14, and the process repeats until voltage values of all the pixels in the column are captured. In one embodiment, control circuitry 16 supplies a negative voltage to negatively biased isolation structures. In other embodiments, the readout circuitry 14 may readout the image data using a variety of other techniques (not illustrated in FIG. 1), such as a serial readout or a full parallel readout of all pixels simultaneously. In different embodiments, the readout circuitry 14 may include amplification circuitry, analog-to-digital conversion ("ADC") circuitry, or other circuitry. In some embodiments, the pixel values are captured and processed by the function logic 18. Such processing may, for example, include image processing, image filtering, image extraction and manipulation, determination of light intensity, etc.

Figure 2A:
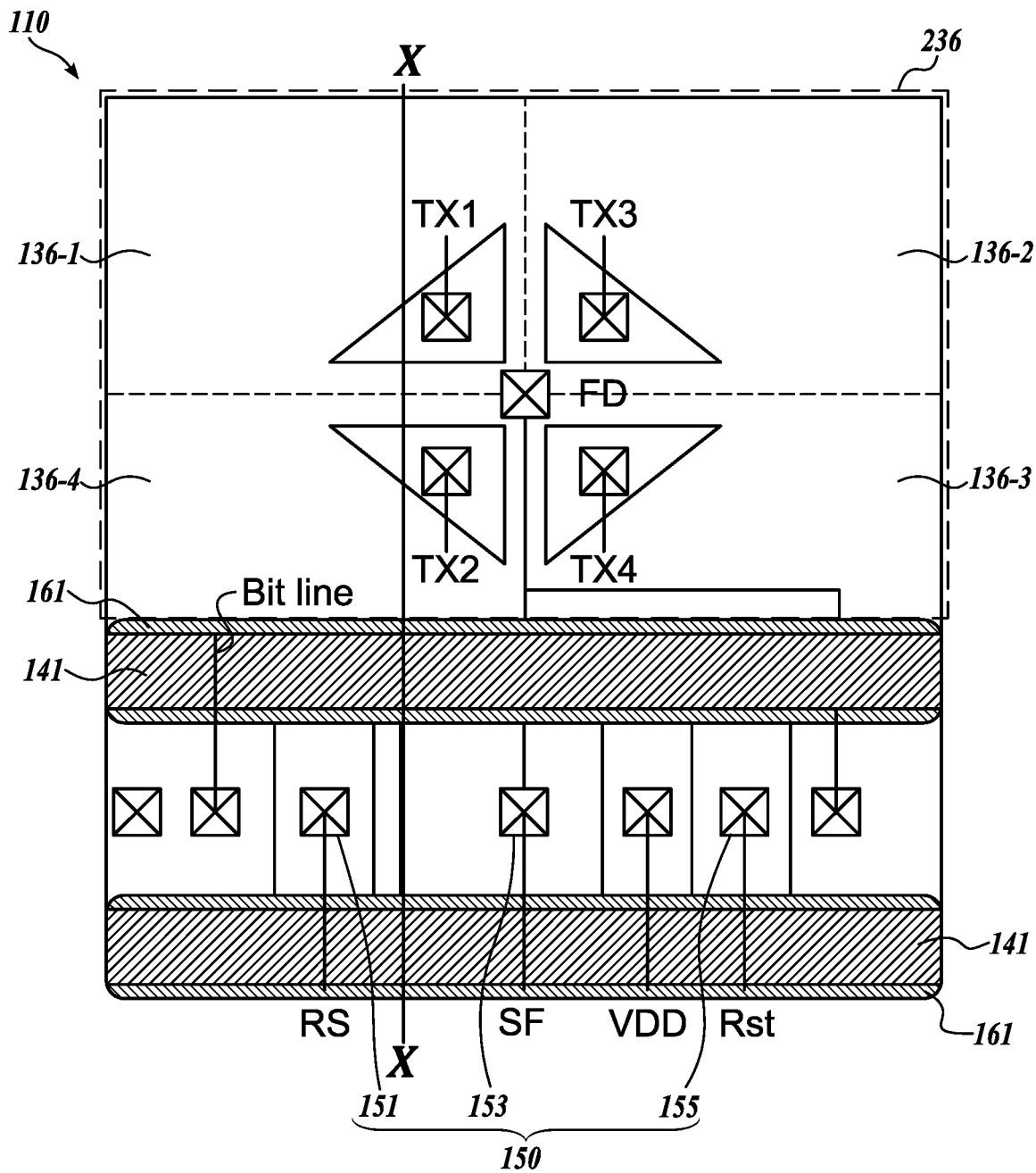
FIG. 2A is a diagram of an example pixel in accordance with an embodiment of the present technology.

FIG. 2A is a diagram of an example pixel in accordance with an embodiment of the present technology. For simplicity, four photodiodes 136-1, 136-2, 136-3 and 136-4 are illustrated, but in other embodiments pixel 110 may include a larger or smaller number of photodiodes 136. An outer perimeter of the pixel 110 is denoted with numeral 236. In the illustrated embodiment, a row of transistors is arranged in a device region on the side of the photodiodes 136-1, 136-2, 136-3 and 136-4. Alternatively, the row of transistors is arranged along an outer perimeter of the photodiodes 136-1, 136-2, 136-3 and 136-4 of the pixel 110. In some embodiments, the row of transistors may include a row select transistor (RS) 151, a source follower transistor (SF) 153, and a reset transistor (Rst) 155 (collectively, transistors 150). In operation, the transistors 150 may be powered from a voltage node VDD. The data may be transferred through the illustrated bit line. Shallow trench isolation (STI) 141 and doped region 161 are explained in more detail with respect to respect to FIGS. 3A and 3B below.

Figure 2B:
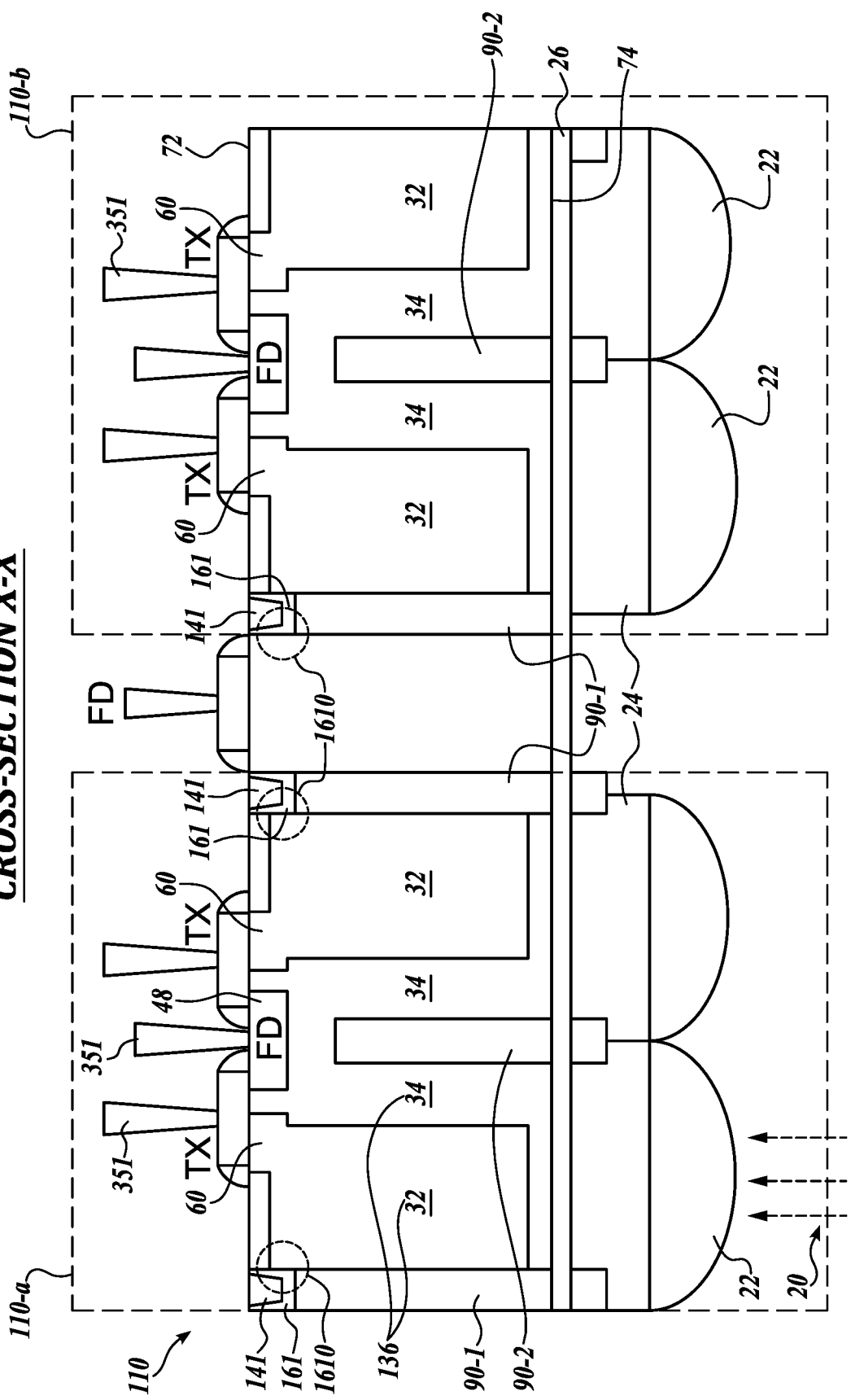
FIG. 2B is a cross-section view of FIG. 2A.

FIG. 2B is a cross-section view X-X of FIG. 2A. For better understanding, FIG. 2A illustrates two adjacent pixels cells 110-a and 110-b, each including two photodiodes 136, even though the cross-sectional view X-X, strictly speaking, would include only one such pair of two photodiodes within one pixel cell. In the illustrated cross-section view, each pixel 110 includes a semiconductor substrate 36 having a P-type epitaxial region 34 formed by an epitaxial growth process. Semiconductor substrate 36 has a front side 72 and a backside 74. Illustrated cross-section view of pixel 110 includes two photodiodes, however, in other embodiments each illustrated pixel cell 110 may include one, two, or higher number of photodiodes depending on the pixel cell configuration. Each photodiode 136-1, 136-2, 136-3, 136-4 (collectively referred to as "136-i" or "136") may include an N-type doped region 32 formed by implanting dopants of N-type, such as arsenic (As) and phosphorus (P), into the P-type epitaxial region 34 on the front side 72 of the semiconductor substrate 36 during an ion implantation process. The P-type epitaxial region 34 and the N-type doped region 32 are collectively referred-to as the semiconductor substrate 36. In some embodiments, the polarity can be reversed, for example, pixel 110 may include a P-type doped region formed within an N-type epitaxial region for accumulating holes as electrical charges in response to incoming light 20.

Pixel 110 may further include a microlens 22 and a color filter 24 for each photodiode formed on the backside 74 of the semiconductor substrate 36. As explained above, for a more thorough understanding of the illustrated embodiment, two adjacent pixels cells 110-*a* and 110-*b*, each including two photodiodes 136 are shown. Their corresponding microlenses 22 and color filters 24 are also illustrated. The microlens 22 may be configured to have a first surface facing the color filter 24 and a second surface facing away from (opposite to) the first surface. The color filter 24 may be configured to have a first side facing a layer of buffer oxide 26 and a second side facing away from (opposite to) the first side. In some embodiments, the microlens 22 may operatively focus the incoming light 20 entered to the backside 74 onto the N-type doped region 32 of the respective photodiode (e.g., photodiode 136-1, 136-4 of FIG. 1). The color filter 24 may operatively filter the incoming light 20 that passes through the color filter 24 from the first side of the color filter 24 to allow a selected wavelength range component of the incoming light 20 (e.g., visible light component) to pass through impinging onto the N-type doped region 32.

In operation, the incoming light 20 to an individual photodiode may pass through the respective microlens 22, the respective color filter 24, and the buffer oxide 26 at the backside 74 of the semiconductor substrate 36 to impinge on the N-type doped region 32 of the respective photodiode during a global exposure or integration period. The resulting electrical charge is accumulated in the N-type doped region 32 of the respective photodiode. This electrical charge may be collected by electrodes 351 of the vertical transfer gate 60 disposed at a front side of the semiconductor substrate 36 and transferred to a floating diffusion (FD) 48 through the vertical transfer gate 60 during a global charge transfer period in response to transfer signal TX. Next, the charges are transferred toward an associated floating diffusion region (FD) 48 during a readout period, for example on a row by row basis.

The N-type doped regions 32 of the pixel 110 may be mutually separated by isolation structures 90-2 that isolate the photodiodes within the region of pixel 110, while allowing electrical charge to reach a floating diffusion region FD. The adjacent pixels 110*a*, 110*b* may be separated by well isolation structures 90-1.

In the illustrated embodiment, a doped region 161 (also referred as a passivation implant region) surrounds each of shallow trench isolation structures (STIs) 141. Sidewalls and bottom portion of STIs typically contains defects and trap sites (e.g., dangling bonds/broken bonds) formed along silicon oxide STIs/silicon interface between STIs and semiconductor substrate 36, for example, formed during etching process of STIs in the semiconductor substrate 36, that can trap electrons or holes lead to generation of current in absence of light referred to as dark current affecting sensitivity of photodiodes. Doped region 161 is a passivation implant region implanted into semiconductor substrate 36 to passivate side walls and bottom portion of STIs reducing defects and/or traps from trapping holes/electrons to reduce dark current. However, in some embodiments the dopant (e.g., boron) may diffuse toward the N-type doped regions 32, thus reducing the effective size of the N-type doped regions 32, which reduces performance of the photodiode. Such diffusion of the dopant toward the photodiode itself is indicated by circles 1610.

FIGS. 3A-3B show top plan views of pixels of an example image sensor in accordance with an embodiment of the present technology. For simplicity, four photodiodes 136-1, 136-2, 136-3 and 136-4 are illustrated, but in other embodiments the pixel array may include a larger or smaller number of photodiodes 136. As illustrated in FIG. 3A, a row of transistors is arranged at the front side 72 of the semiconductor substrate 36. In some embodiments, these transistors may include a row select transistor (RS) 151, a source follower transistor (SF) 153, and a reset transistor (Rst) 155. In other embodiments, the electrical charge of the photodiodes 136-1, 136-2, 136-3 and 136-4 may be managed with a larger or smaller number of transistors, and also different types of transistors depending on the pixel circuit configuration. The illustrated pixel 110 demonstrates a "four-transistor configuration" that is the pixel transistors for the pixel 110 include a transfer transistor, row select transistor (RS) 151, source follower transistor (SF) 153, and a reset transistor (Rst) 155. In some embodiments, pixel cell 110 may be configured to a "three-transistor configuration" and include only transfer transistor, source follower transistor (SF) 153, and a reset transistor (Rst) 155. In some embodiments, pixel cell 110 may be configured to a "five transistor configuration" and include transfer transistor, row select transistor (RS) 151, source follower transistor (SF) 153, a reset transistor (Rst) 155 and an overflow transistor or a dual floating diffusion (DFD) transistor. Collectively, these transistors are enumerated as 150.

The row of transistors 150 may be partially surrounded by shallow trench isolations (STIs) 141, located in the space between the transistors and the illustrated photodiodes 136 and the next group of the photodiodes 136 (not shown). As illustrated in FIG. 3B, the doped region 161 may surround the STIs 141. In some embodiments, the formation of the STIs 141 may increase dark currents to the row of transistors 150. For example, the STIs 141 are formed by etching into the semiconductor substrate 36, which can cause defects in the semiconductor substrate 36. These defects may, in turn, generate noise and dark current, and may also facilitate current leakage toward the photodiodes. After the etching, the STIs 141 may be filled with a dielectric material such as oxide. Because the STI-Si border contains defects and also have difference in the refraction index, the STIs 141 may need to be passivated by, for example, doping with dopants having same conductive type as the surrounding semiconductor substrate 36, e.g., P-type dopant such as boron (B), to form a hole accumulation layer (not illustrated) preventing defects and traps from trapping electrons. However, the boron may diffuse toward the regions of photodiodes, as seen in FIG. 3B, where the doped region 161 having opposite conductive type to photodiodes encroaches onto the photodiodes 136-3 and 136-4, therefore effectively reducing the area of the photodiodes.

Figure 3C:
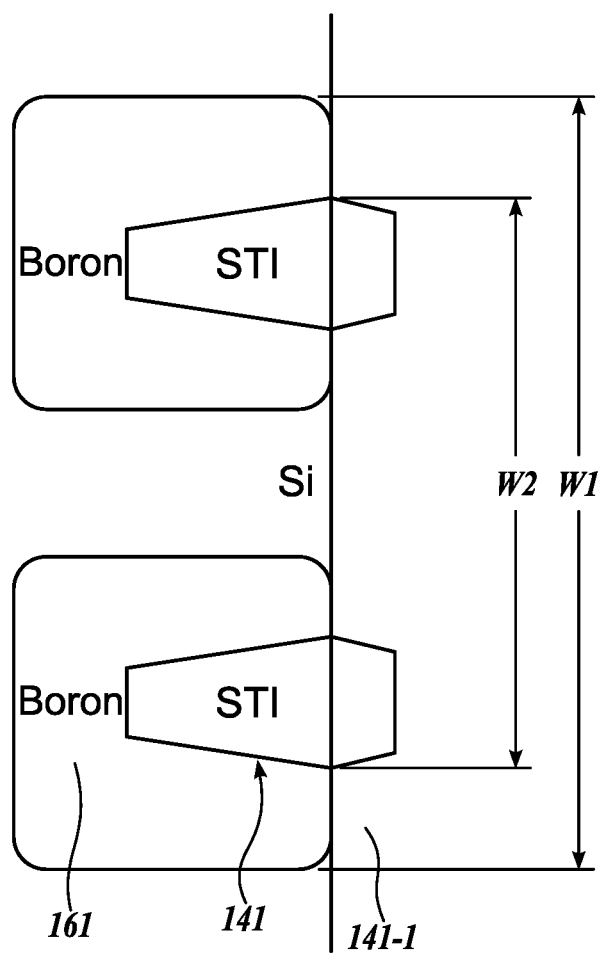

FIG. 3C shows a cross-section view along line A-A of FIG. 3B. The illustrated STIs 141 may be at least partially embedded in the semiconductor substrate 36. A doped region 161 surrounds the STIs 141. The upper STI structure 141-1 extends above the semiconductor substrate 36. A distance between the peripheral points of the STIs is denoted as W2, which may also be referred to as the ideal width of the device, i.e., the width that is between one STI structures to the adjacent STIs, without the added space needed for the doped regions. A distance between the peripheral points (also referred to as a "width") of the boron doped region is labeled W1. When boron doping is implanted around the STIs 141, the boron may diffuse into the semiconductor substrate and toward the area of the nearby photodiodes. As a result, the width W1 is greater than the width W2. As photodiodes get smaller and more compact with successive generations of product, the effective loss of the area of the photodiodes due to the boron diffusion becomes relatively more significant.

Figure 4:
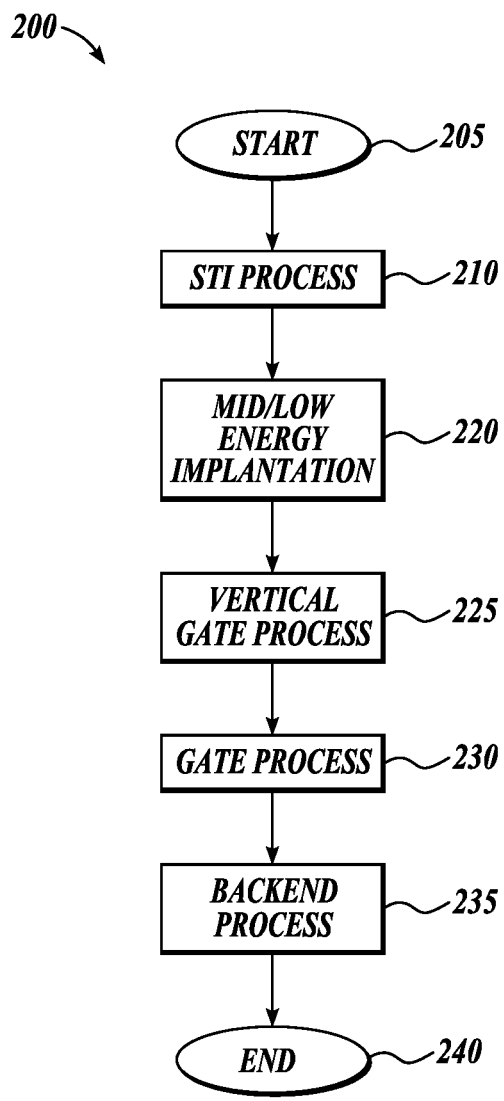
FIG. 4 is a flow diagram of a manufacturing process in accordance with an embodiment of the present technology.

FIG. 4 is a flow diagram of a manufacturing process 200 in accordance with an embodiment of the present technology. In some embodiments, the method may include only some of the steps illustrated in the flowchart or may include additional steps that are not illustrated in the flowchart 200.

The method 200 may be used to fabricate an exemplary pixel 110 of FIG. 3. The method 200 starts in block 205. In block 210, a semiconductor substrate 36 is provided, and the STI structures 141 are formed at the front side of the semiconductor substrate 36. The STIs 141, when etched into the silicon substrate 36, may result in an asymmetric photoresist (PR) profile. This asymmetric PR means that defects may occur in the substrate 36 where the STIs 141 are etched. Therefore, the resulting asymmetric profile may degrade the performance of the photodiodes 136 through increased leakage and dark current. The STIs may be doped with Boron to passivate the trench. After the doping, Boron atoms may diffuse into the silicon substrate 36 and encroach onto the area of the photodiode.

In block 220, dopants are implanted into the silicon substrate 36 to form deep P-type and/or N-type doped regions. These dopants may be implanted at high- or mid-energy. The high energy and mid energy implantation formulates photodiodes at deep portion into the semiconductor substrate 36. In block 225, the vertical transfer gates 60 and vertical electrodes electrodes) 49 are formed in the semiconductor substrate 36. Next, in block 230, gates of transistors such as the reset transistor, source follower transistor, row select transistor and transfer transistor shown in FIG. 2 are formed. In block 235, the backend process is completed. The backend process may include adding color filters 24 and microlenses 22 for each respective photodiode. The illustrated process 200 ends in block 240.

Figure 5:
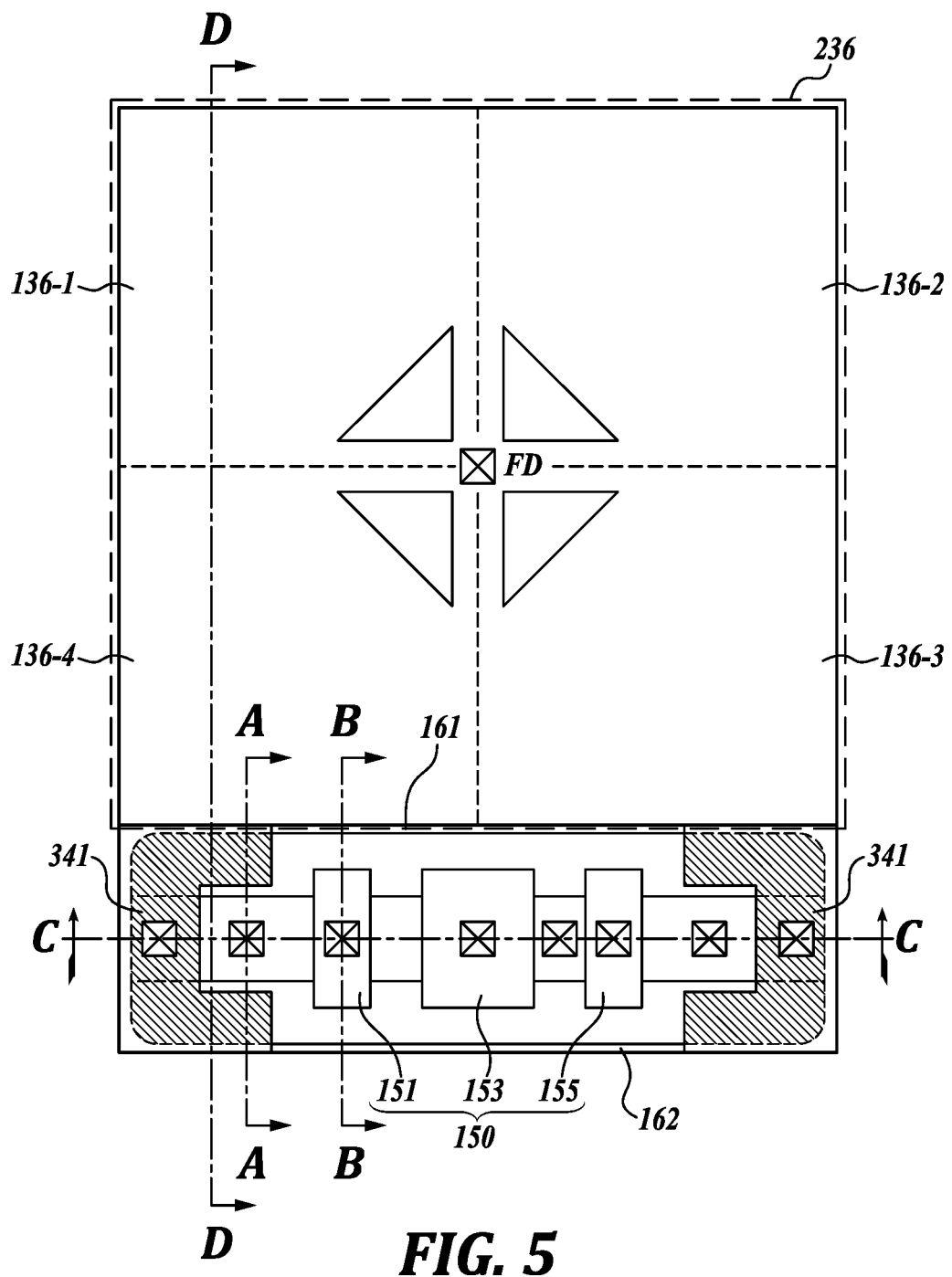
FIG. 5 shows a top plan view of an example image sensor in accordance with an embodiment of the present technology.

FIG. 5 shows a top plan view of an example pixel in accordance with an embodiment of the present technology. In the depicted example, a pixel 510 includes four photodiodes 136-1, 136-2, 136-3 and 136-4 are illustrated, but in other embodiments the pixel may include a larger or a fewer number of photodiodes 136. An outer perimeter of the pixel 110 is denoted with numeral 236. In some embodiments, the illustrated row of transistors 150 is arranged along the outer perimeter 236 of the pixel 110 adjacent to photodiodes, for example photodiodes 1363, 136-4 in FIG. 5. Illustrated row of transistors 150 may include the row select transistor (RS) 151, the source follower transistor (SF) 153, and the reset transistor (Rst) 155. In some embodiments, the row of transistors 150 is bracketed by at least two C-shaped isolation structures 341, e.g., a first and a second isolation structures (herein may be referred to as isolation structures 341 for simplicity). Restated, the two isolation structures 341 define a device region (or peripheral region) for the row of transistors 150 that is associated with a pixel (e.g., pixel 110). In the illustrated embodiments, each transistor in the row of transistors 150 are laterally spaced, i.e., the gate of each transistor and the source/drain of each transistors are laterally spaced from the respect gate and the sources/drains of adjacent transistors. In embodiments, the device region (or peripheral region) for the row of transistors 150 adjacent to photodiodes, such as in the outer perimeter of the photodiodes in the pixel region of pixel 510. In some embodiments, the device region (or peripheral region) for the row of transistors 150 may be disposed vertically below or above the photodiodes in the pixel region of pixel 510. In some embodiments, the device region (or peripheral region) for the row of transistors 150 may be disposed on the sides (e.g., left or right) with respect to the region of photodiodes, where the row of transistors 150 may be oriented and alight in a column or vertical direction. It should be appreciated that the number of transistors in the row of transistors 150 may varied depending on the pixel cell configuration, such as pixel size and dynamic range configuration without departing from the teaching of present disclosure. For example, the row of transistors 150 may include two, three, four, five transistors or more transistors.

In embodiments, the C-shaped isolation structures 341 are positioned adjacent to photodiodes in a manner that with doped region 162 surround and conformal the trench structures of isolation structures 341, such that the doped region 162 does not invade or encroached the photodiodes, i.e., there existing a spacing or a semiconductor region between the doped region 162 and adjacent photodiodes, wherein the spacing or the width of the semiconductor region is at least 0.1 μm and configured based on the pixel size and maximum spacing allowed between device region and photodiodes.

These isolation structures may be filled by a conductive material, such as polysilicon, or metal. The illustrated isolation structures 341 at least partially surround the doped region 162. In some embodiments, the isolation structures 341 may be formed together with forming the vertical transfer gate (VTG) and have same trench depth in the semiconductor substrate 36 with respect to front side 72 as the vertical transfer gate (VTG). As a result, the isolation structures 341 generally do not cause defects in the semiconductor substrate 36. In operation, the isolation structures 341 reduce dark currents toward the area of the photodiodes by accumulating holes (positive charges) in the semiconductor substrate 36 when each of the isolation structures 341 are constantly biased by a negative voltage, thus accumulating holes to reduce dark currents toward the area of the photodiodes. Also shown are section lines A-A, B-B, and C-C, which are cross-sections illustrated in FIGS. 5A, 5B, and 5C respectively.

Figure 5A:
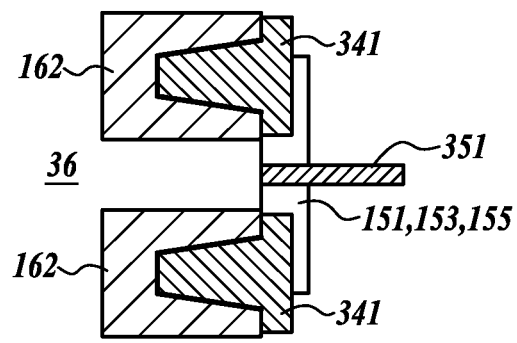
FIGS. 5A-5D are cross-section views of FIG. 5 in accordance with an embodiment of the present technology.

FIG. 5A shows a cross-section of FIG. 5 along section line A-A. In the illustrated embodiment, the isolation structures 341 extend into the semiconductor substrate 36. The isolation structures 341 inside the substrate 36 are surrounded by doped regions 162. The row of transistors 151, 153 and 155 is at least partially surrounded by the isolation structures 341. In some embodiments, isolation structures 341 are formed at the same time as the formation of VTG for transfer transistors. As such each of isolation structures 341 can have similar mechanical and electrical properties as the vertical transfer gate structure of transfer transistors. In addition, as there is no need to form shallow trench isolation structures, at least one photoresist mask and etching process step may be saved, thereby reducing processing complication and cost. As a result, dark current toward on the photodiode region 136 may be decreased.

Figure 5B:
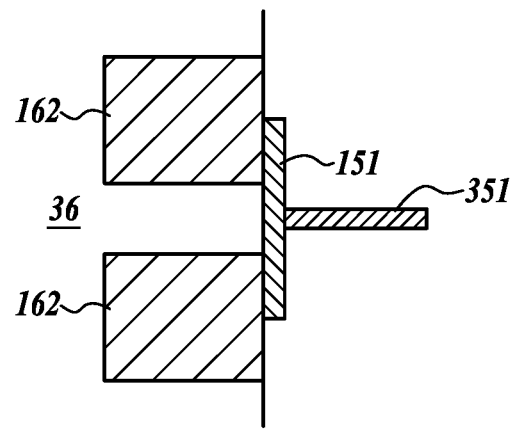

FIG. 5B shows the cross-section of FIG. 5 along section line B-B. The doped region 162 may be doped with boron. The contact 351 may be connected to a transistor 151, e.g., a row select transistor (RS).

Figure 5C:
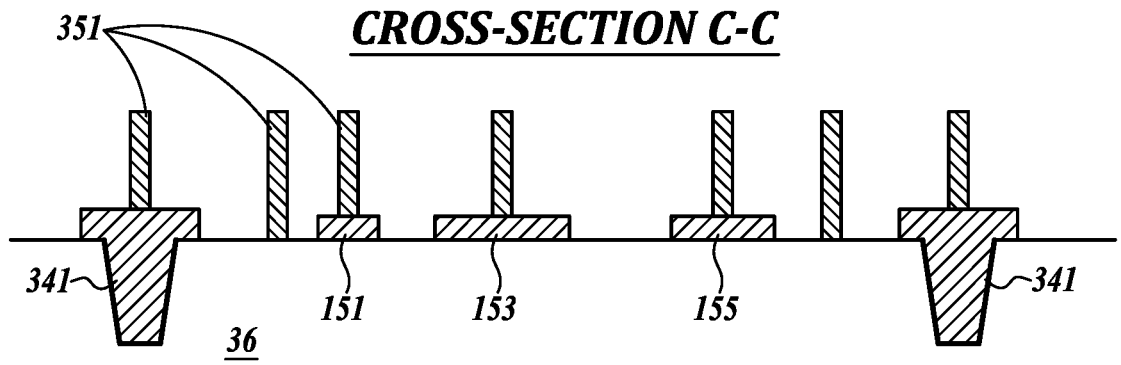

FIG. 5C shows the cross-section of FIG. 5 along section line C-C. The isolation structures 341 at least partially surround the row of transistors 151, 153, and 155. For example, a first isolation structures and a second isolation structure defined the device region for the row of transistors 151, 153, and 155 wherein the first isolation structures disposed on one end adjacent to transistor 151 and the second isolation structure disposed on the other end adjacent to transistor 153 bracketing the row of transistors providing isolation between the row of transistors 151, 153, 155 of a pixel 510 to the row of transistors 151, 153, 155 of adjacent pixel 510, and between the row of transistors 151, 153, 155 and the photodiodes within pixel 510. In some embodiments, the isolation structures 341 may extend into the front side 72 of the semiconductor substrate 36. Contacts 351 are connected to the row of transistors 151, 153, and 155. In some embodiments, the contacts 351 may electrically bias the isolation structures 341, as explained in more details below. In embodiments, the depth that each of the isolation structures extend into the semiconductor substrate 36 is at least equal to or greater than the junction depth of source and drain regions for the transistors. For example, the depth that each of the isolation structures extend into the semiconductor substrate 36 is greater than the implanted junction depth of source and drain of the reset transistor, the implanted junction depth of source and drain of the source follower transistor, and/or the implanted junction depth of source and drain of the row select transistor.

In some embodiments, the isolation structures 341 may be filled with an electrically conductive material such as polysilicon or metal. In some embodiments, the isolation structures 341 may be negatively voltage biased in the range of, for example, −1.4 V to −1.0 V.

In operation, negative voltage biasing of the isolation structures accumulates positively charged holes in the proximity of the isolation structures 341. These positively charged holes passivate the sidewalls of the isolation structure 341, which, in turn, reduces dark current and leakage toward the photodiode 136 region.

Figure 5D:
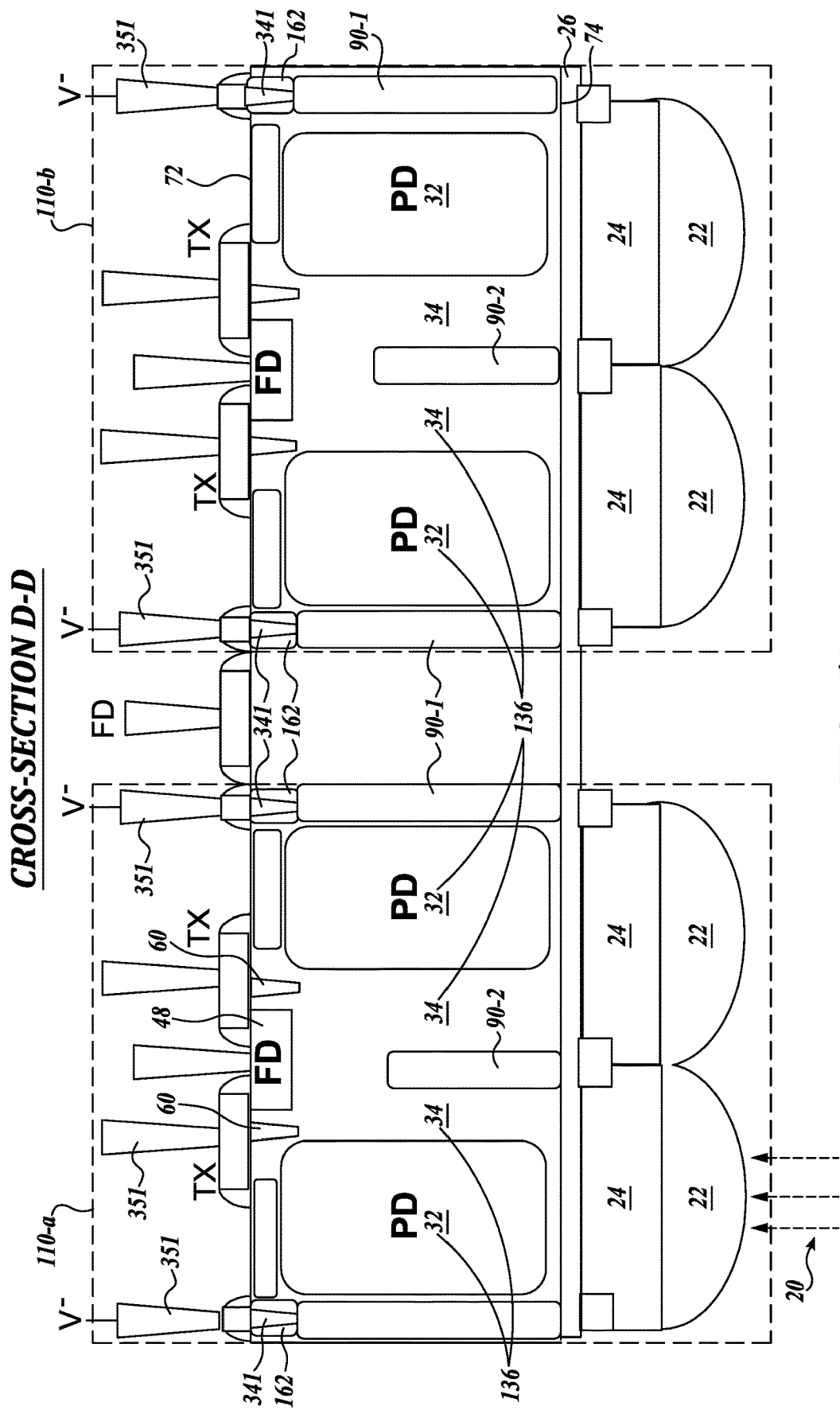

FIG. 5D is a cross-section view D-D of FIG. 5. For better understanding, FIG. 5D illustrates two adjacent pixels cells 110-a and 110-b, each including two photodiodes 136, even though the cross-sectional view X-X, strictly speaking, would include only one such pair of two photodiodes within one pixel cell. Elements similar to FIG. 2B in FIG. 5D have been denoted the same reference number. Therefore, detailed description thereof will be omitted. Illustrated cross-section view of pixel 110 includes two photodiodes, however, in other embodiments each illustrated pixel cell 110 may include one, two, or higher number of photodiodes depending on the pixel cell configuration. Each photodiode 136-1, 136-2, 136-3, 136-4 (collectively referred to as "136-i" or "136") may include an N-type doped region 32 formed by implanting dopants of N-type, such as arsenic (As) and phosphorus (P), into the P-type epitaxial region 34 on the front side 72 of the semiconductor substrate 36 during an ion implantation process. In some embodiments, the polarity can be reversed, for example, pixels 110a, 110b may include a P-type doped region formed within an N-type epitaxial region for accumulating holes as electrical charges in response to incoming light 20.

With the illustrated pixels 110a, 110b, the isolation structures 341 are charged to a negative voltage V⁻. In response, the positively charged holes in the doped region 162 are pulled toward the isolation structures 341, which reduces dark currents toward the area of the photodiodes.

Figure 6:
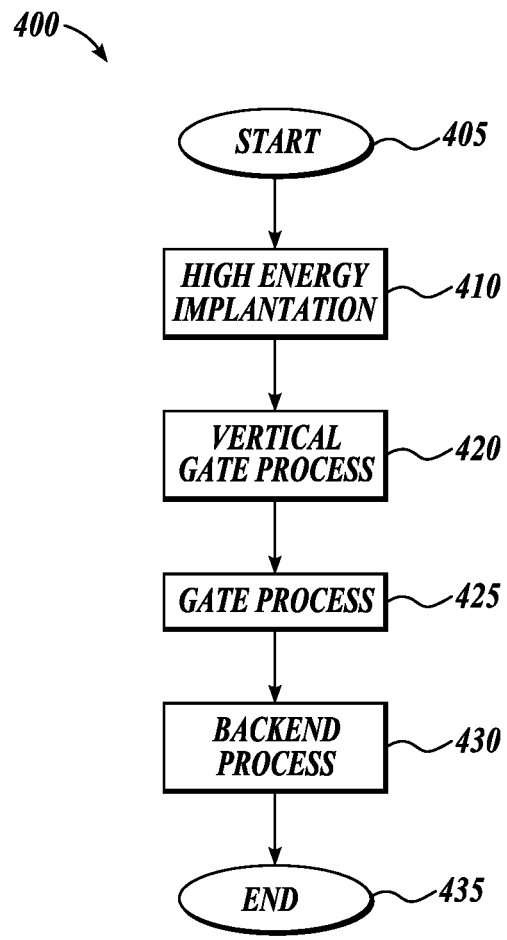
FIG. 6 is a flow diagram of a manufacturing process in accordance with an embodiment of the present technology.

As illustrated, STI the isolation structures 341 may be formed together with forming the vertical transfer gates (VTG) 60 of transfer transistors in the pixels and can have same trench depth in the semiconductor substrate 36 with respect to front side 72 as the vertical transfer gate (VTG) 60 and reduce fabrication cost as at least one lithography process and etching process can be eliminated FIG. 6 is a flow diagram of a method 400 in accordance with an embodiment of the present technology. In some embodiments, the method may include only some of the steps in the flowchart or may include additional steps that are not illustrated in the flowchart 400.

The method 400 may be used to fabricate exemplary pixels of FIG. 5. The method 400 starts in block 405. In block 410, high energy implantation creates N-type doped region 32 in the substrate 36. In the illustrated method, there is no need for an STI process as described in FIG. 4. Instead, in block 420, the isolation structures 341 are formed during the VTG process when the vertical gates, e.g., vertical transfer gate, are formed. Additionally, the C-shaped isolation structures 341 are formed on the front side of the semiconductor substrate 36 as part of the vertical gate process. The isolation structures 341 bracket a row of transistors 150. In block 425, the gate process continues by forming contacts 351 and metal electrodes 353. The metal electrodes 353 may be configured to electrically bias the isolation structures, as described below.

As explained with reference to FIG. 5C above, the isolation structures 341 may be negatively voltage-biased, leading to accumulation of the positively charged holes at the trench side wall. The accumulated positively charged holes may passivate the trench side walls, thereby eliminating or at least reducing a need to add an implanted passivation layer. In other embodiments, the isolation structures 341 may be negatively voltage-biased, thereby accumulating positively charged holes at the surface of the isolation structures 341. In block 430, the backend process, which may include forming of color filters 24 and microlenses 22, is completed. The method 400 ends in block 435.

Figure 7A:
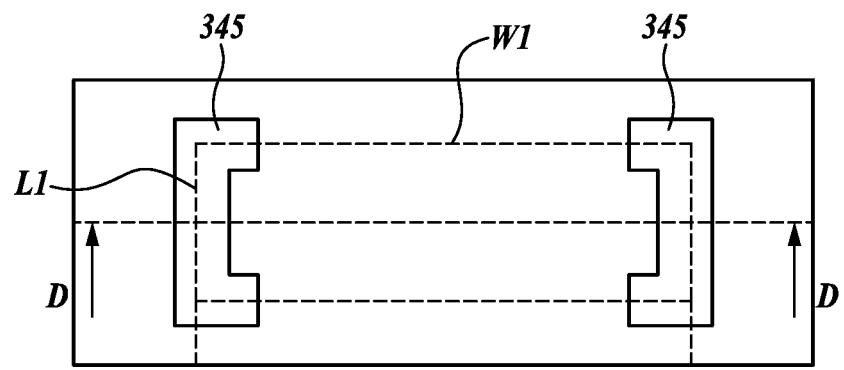
FIG. 7A is a top view of a manufacturing step of an image sensor in accordance with the present technology.
Figure 7B:
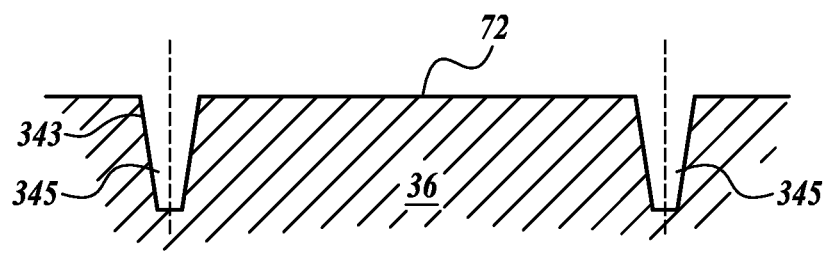
FIG. 7B is a cross-sectional view of a manufacturing step of an image sensor in accordance with the present technology.

FIGS. 7A-10B show manufacturing steps for an exemplary image sensor 110 shown in FIG. 5. In each pair of figures "A" and "B" below, the "A" figure shows a top view of the semiconductor substrate 36, while the "B" figure shows a cross-section along line D-D of the semiconductor substrate 36. Turning attention now to FIGS. 7A and 7B, on the front side 72 of the semiconductor substrate 36, an opening 345 in the shape of letter "C" is etched, for example by a wet etching process, a dry etching process or a combination of dry and wet etching processes. In other embodiments, other shapes may be used to bracket the transistors for individual pixel, for example the shape of letter "U." Generally, the shape of the opening 345 defines the shape of the later-formed isolation structure 341. The openings 345 may be at least partially embedded into the front side 72 of the semiconductor substrate 36. In some embodiments, a liner 343 is formed inside the opening 341. In some embodiments, the liner 343 is silicon oxide or other dielectric material. In some embodiments, the liner 343 may be formed by thermal oxidation process.

Figure 8A:
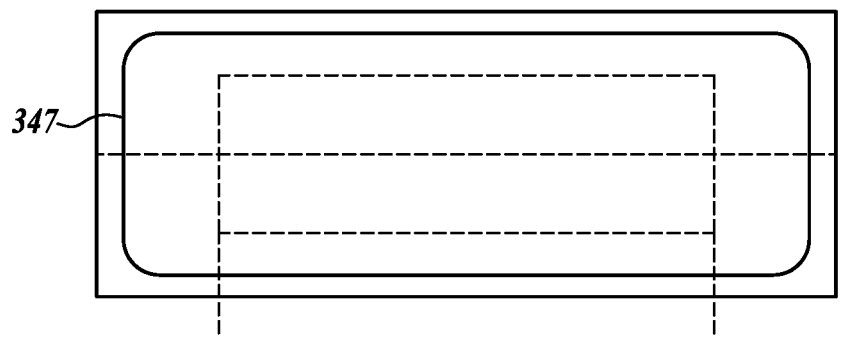
FIG. 8A is a top view of a manufacturing step of an image sensor in accordance with the present technology.
Figure 8B:
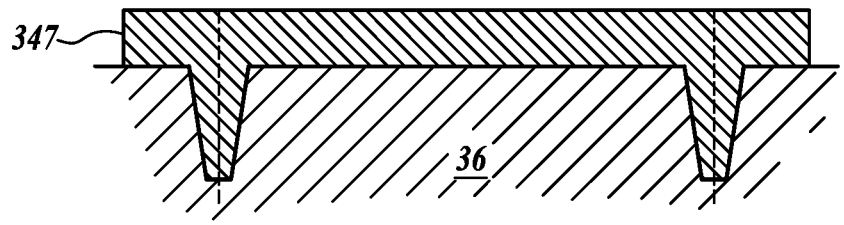
FIG. 8B is a cross-sectional view of a manufacturing step of an image sensor in accordance with the present technology.

FIGS. 8A-8B show manufacturing process for an embodiment of a sample image sensor in accordance with the present technology. FIG. 8A shows a top view of the semiconductor substrate 36, while FIG. 8B shows a cross-section of the semiconductor substrate 36. The conductive material 347, for example a polysilicon or n-type doped polysilicon, may be formed as a polysilicon layer deposited on the front side of the semiconductor substrate 36 fill the openings 341. In some embodiments, the conductive material 347 may be a metal. In some embodiments, a conductive material 347 is deposited into the openings 345 to fill the openings 341.

Figure 9A:
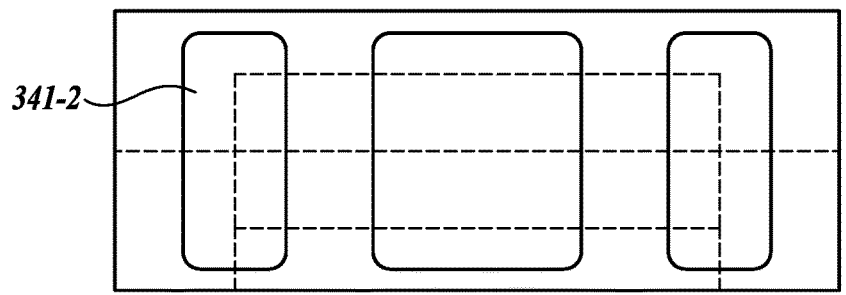
FIG. 9A is a top view of a manufacturing step of an image sensor in accordance with the present technology.
Figure 9B:
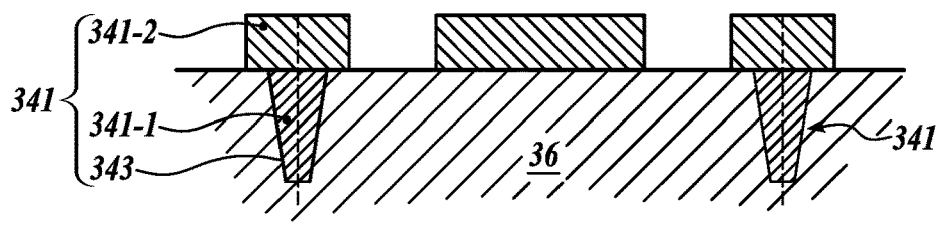
FIG. 9B is a cross-sectional view of a manufacturing step of an image sensor in accordance with the present technology.

FIGS. 9A-9B show manufacturing process for an embodiment of a sample image sensor in accordance with the present technology. FIG. 9A shows a top view of the semiconductor substrate 36, while FIG. 9B shows a cross-section of the semiconductor substrate 36. With the illustrated embodiment, the filling material 347 is etched to form the isolation structures 341. In some embodiments, an annealing process may be performed after deposition and pattern process of conductive material to activate the conductive material, for example to active the doped polysilicon. In some embodiments, each of the isolation structures 341 include a trench isolation structure 341-1 within the semiconductor substrate 36 and an upper isolation structure 341-2 that extends out of the semiconductor substrate 36 and having a width greater than the corresponding trench isolation structure 341-1 or 341-2. The trench isolation structure 341-1 of each the isolation structures 341 extended a depth into the semiconductor substrate 36. In some embodiments, the isolation structures 341 are formed in the same process as the formation of vertical transfer gates of transfer transistors and the extend depth of trench isolation structure 341-1 of each isolation structure 341 is the same as the vertical transfer gate structures of transfer transistors. In some embodiments, the isolation structures 341 have the same mechanical and electrical properties as the vertical transfer gates. The isolation structure 341-2 of each isolation structures 341 may be laterally spaced from the gates of transistors. In some embodiments, the isolation structure 341 has a liner 343 that may be made of a dielectric material, such as silicon dioxide.

Figure 10A:
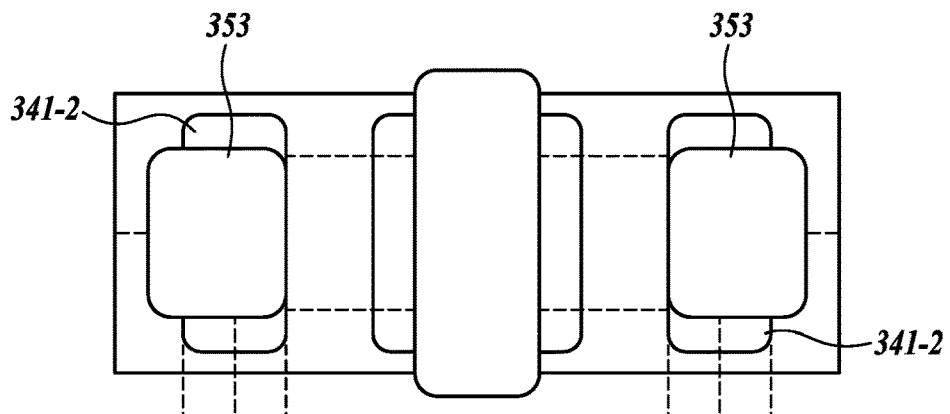
FIG. 10A is a top view of a manufacturing step of an image sensor in accordance with the present technology.
Figure 10B:
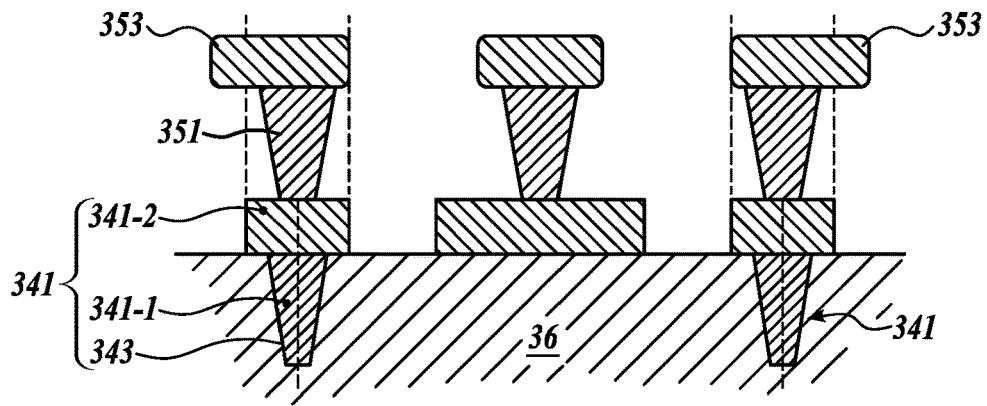
FIG. 10B is a cross-sectional view of a manufacturing step of an image sensor in accordance with the present technology.

FIGS. 10A-10B show manufacturing process for an embodiment of a sample image sensor in accordance with the present technology. FIG. 10A shows a top view of the semiconductor substrate 36, while FIG. 10B shows a cross-section of the semiconductor substrate 36. In some embodiments, contacts 351 may be formed to electrically contact the corresponding isolation structures 341. Metal electrodes 353 may also be formed to electrically connect to corresponding contacts 351. In operation, the contacts 351 electrically bias the isolation structures 341. In different embodiments, the isolation structures may be negatively voltage-biased.

Figure 11A:
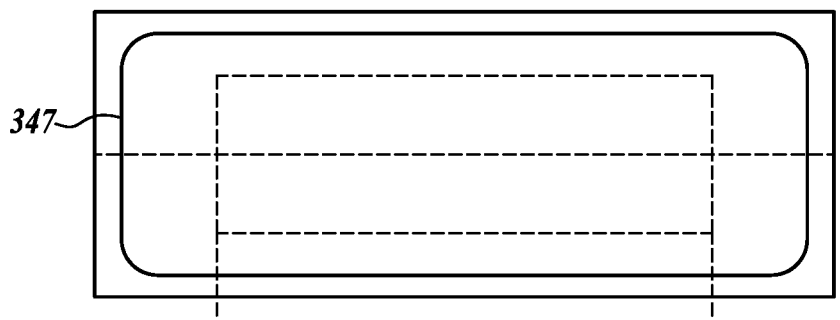
FIG. 11A is a top view of a manufacturing step of a second embodiment of an image sensor in accordance with the present technology.
Figure 11B:
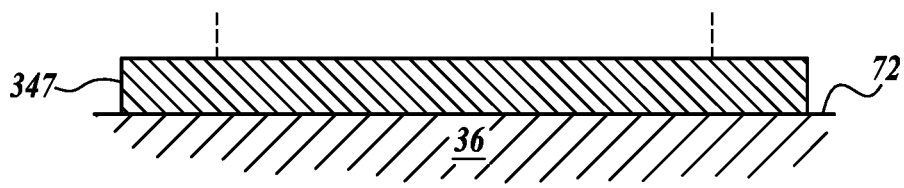
FIG. 11B is a cross-sectional view of a manufacturing step of a second embodiment of an image sensor in accordance with the present technology.

FIGS. 11A-13B show manufacturing process for another embodiment of an image sensor in accordance with the present technology. FIG. 11A shows a top view of the semiconductor substrate, while FIG. 11B shows a cross-section of the semiconductor substrate. A semiconductor substrate 36 is provided, having a front side 72. Next, the conductive material 347 is formed on the front side 72 of the semiconductor substrate 36. In some embodiments, the conductive material 347 is doped polysilicon. In other embodiments, the conductive material 347 may be a metal.

Figure 12A:
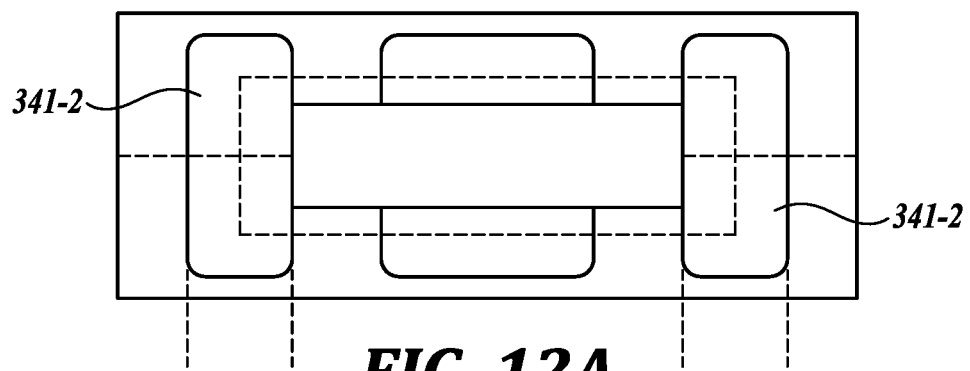
FIG. 12A is a top view of a manufacturing step of a second embodiment of an image sensor in accordance with the present technology.
Figure 12B:
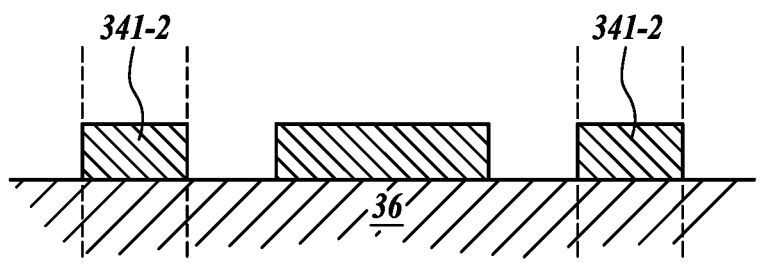
FIG. 12B is a cross-sectional view of a manufacturing step of a second embodiment of an image sensor in accordance with the present technology.

FIGS. 12A-12B show another step of the manufacturing process for the embodiment of the image sensor. FIG. 12A shows a top view of the semiconductor substrate, while FIG. 12B shows a cross-section of the semiconductor substrate. In this step, the conductive material 347 is etched to form upper trench isolation structures 341-2. The isolation structures 341-2 are carried by the front side 72 of the semiconductor substrate 36. In the illustrated embodiment, the isolation structures are outside of the semiconductor substrate 36.

Figure 13A:
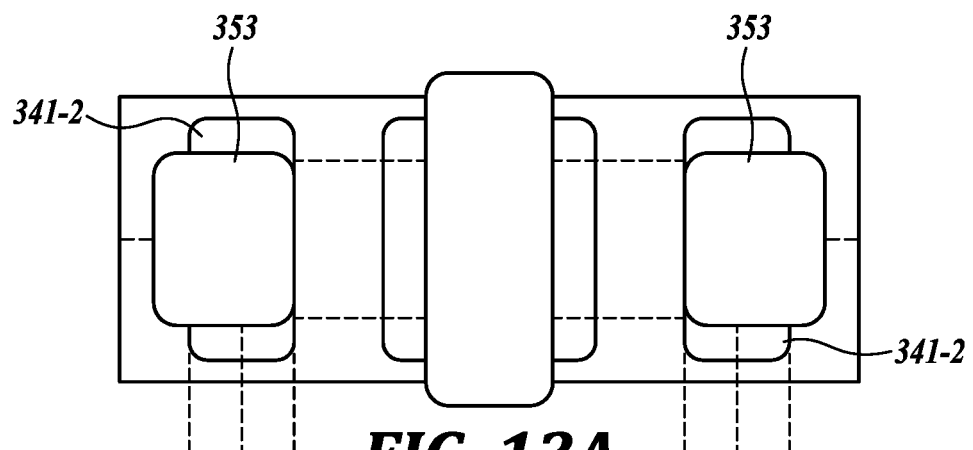
FIG. 13A is a top view of a manufacturing step of a second embodiment of an image sensor in accordance with the present technology.
Figure 13B:
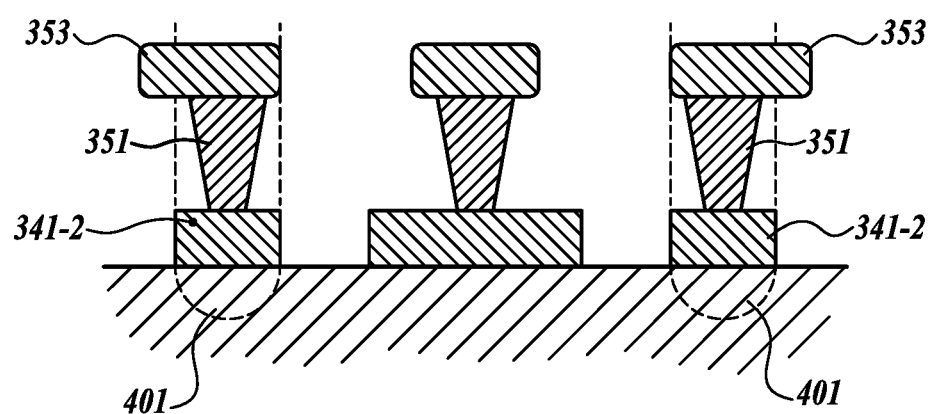
FIG. 13B is a cross-sectional view of a manufacturing step of a second embodiment of an image sensor in accordance with the present technology.

FIGS. 13A-13B show another step of the manufacturing process for the embodiment of the image sensor. FIG. 13A shows a top view of the semiconductor substrate, while FIG. 13B shows a cross-section of the semiconductor substrate. In some embodiments, contacts 351 are attached to corresponding isolation structures 341-2. Metal electrodes 353 are electrically connected to corresponding contacts 351. In operation, the metal electrodes 353 electrically bias the isolation structures 341-2 to, e.g., a negative voltage. In response, holes 401 accumulate in the semiconductor substrate 36 proximate to the isolation structures 341-2, which may reduce a need to passivate the trench sidewall. In some embodiments, the isolation structures 341-2 are negatively electrically-biased in the range of −1.4V to −1.0V.

Many embodiments of the technology described above may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured or constructed to perform one or more of the computer-executable instructions described above. Of course, any logic or algorithm described herein can be implemented in software or hardware, or a combination of software and hardware.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a plurality of pixels arranged in rows and columns of a pixel array disposed in a semiconductor substrate, wherein photodiodes of an individual pixel are configured to receive an incoming light through a backside of the semiconductor substrate, wherein a front side of the semiconductor substrate is opposite from the backside;
   a plurality of transistors disposed proximate to the front side of the semiconductor substrate, and arranged in a row along an outer perimeter of the photodiodes of the respective pixel;
   a plurality of isolation structures arranged to bracket the row of transistors; and
   a plurality of contacts electrically contacting the plurality of isolation structures, wherein the contacts are configured to voltage-bias the plurality of isolation structures.

2. The image sensor of claim 1, wherein each individual isolation structure is C-shaped.

3. The image sensor of claim 1, wherein each individual isolation structures comprise a trench isolation structure embedded into the substrate, and an upper isolation structure carried by the front side of the substrate.

4. The image sensor of claim 1, wherein the plurality of isolation structures are negatively voltage-biased.

5. The image sensor of claim 4, wherein the plurality of isolation structures are negatively voltage-biased at −1.4 V to −1.0 V.

6. The image sensor of claim 1, wherein the isolation structures extend into the semiconductor substrate from the front side of the semiconductor substrate.

7. The image sensor of claim 1, wherein the isolation structures are at least partially surrounded by a doped region of the semiconductor substrate.

8. The image sensor of claim 1, wherein the isolation structures are entirely carried by the semiconductor substrate at the front side of the semiconductor substrate without being embedded into the semiconductor substrate.

9. The image sensor of claim 1, wherein the isolation structures include a lining of the isolation structures.

10. The image sensor of claim 1, wherein the plurality of transistors include one or more transistors selected from a group consisting of row select transistors (RS), source follower transistors (SF) and reset transistors (Rst).

11. A method for manufacturing an image sensor, comprising:
providing a semiconductor substrate, wherein the semiconductor substrate has a backside and a front side opposite from the backside;
etching an opening proximate to the front side of the substrate;
depositing a conductive material into the openings in the substrate;
etching the conductive material to form isolation structures arranged to bracket a row of transistors; and
forming a plurality of contacts in contact with corresponding isolation structures, wherein the plurality of contacts are configured to electrically bias the isolation structures.

12. The method of claim 11, further comprising forming a plurality of metal electrodes, wherein the metal electrodes are electrically connected to corresponding contacts.

13. The method of claim 11, further comprising forming a trench liner in the openings.

14. The method of claim 11, wherein the isolation structures bracket a row of transistors that are configured along an outer perimeter of the photodiodes.

15. The method of claim 11, wherein the isolation structures are C-shaped.

16. The method of claim 11, wherein the isolation structures are negatively voltage-biased.

17. The method of claim 11, further comprising forming a plurality of transistors between the plurality of isolation structures.

18. A method for manufacturing an image sensor, comprising:
providing a semiconductor substrate, wherein the semiconductor substrate is bounded by a backside and a front side opposite from the backside;
depositing a conductive material onto the front side of the substrate;
etching the conductive material to form a plurality of isolation structures arranged to bracket a row of transistors;
forming a plurality of contacts in contact with corresponding isolation structures; and
wherein the plurality of contacts are configured to electrically bias the isolation structures.

19. The method of claim 18, wherein the isolation structures are C-shaped.

20. A pixel, comprising:
a semiconductor substrate having an active region and a transistor region adjacent to the active region;
a plurality of photodiodes formed on a front side of the semiconductor substrate and disposed in the active region, wherein each photodiode is configured to receive an incoming light through a backside of the semiconductor substrate opposite to the front side;
at least two transistors disposed proximate to the front side of the semiconductor substrate, and in the transistor region;
a first isolation structure disposed on the front side of the semiconductor substrate adjacent to the plurality of photodiodes and in the transistor region; and
a second isolation structure disposed on the front side of the semiconductor substrate adjacent to the plurality of photodiodes and in the transistor region;
wherein the first isolation structure and the second isolation structure are configured to bracket the transistor and isolate the transistor from the plurality of photodiodes; and
wherein the first and second isolation structures are coupled to a negative voltage.

21. The pixel of claim 20, wherein the first and the second isolation structures are C-shaped.

22. The pixel of claim 20, wherein each of the first and the second isolation structures include an upper conductive structure formed on the front side of the semiconductor substrate and wherein the upper conductive structure is coupled to receive the negative voltage.

23. The pixel of claim 22, wherein a first hole accumulation layer is formed underneath the upper conductive structure, and wherein the first hole accumulation layer is laterally formed in the semiconductor substrate between the photodiodes in the active region and the transistor in the transistor region.

24. The pixel of claim 20, wherein each of the first and the second isolation structures further include a trench structure extended from the upper portion into the semiconductor substrate, the trench structure having a conductive material deposited therein and the conductive material is coupled to receive the negative voltage forming a second hole accumulation layer surrounding the trench structure.

25. The pixel of claim 24, further comprising:
a floating diffusion disposed on the front side of the semiconductor substrate;
a plurality of transfer transistors disposed on the front side of the semiconductor substrate, each of the plurality of transfer transistors configured to transfer image charges from each respective photodiode to the floating diffusion, where in each of the plurality of transfer transistors includes a vertical transfer gate extending to a depth from the front side into the semiconductor substrate;
wherein the trench structure of each of the first and the second isolation structures is configured to extend into the semiconductor substrate to the same depth as the vertical transfer gate of transfer transistors.

26. The pixel of claim 25, further comprising:
a doped region disposed in the semiconductor substrate, the doped region surrounding the trench structure and being overlapped with at least a portion of the second hole accumulation layer.

27. The pixel of claim 20, wherein the negative voltage ranges from −1.4 V to −1.0 V.

* * * * *